United States Patent [19]

Tran

[11] Patent Number: 4,825,413
[45] Date of Patent: Apr. 25, 1989

[54] BIPOLAR-CMOS STATIC RAM MEMORY DEVICE

[75] Inventor: Hiep V. Tran, Carrollton, Tex.

[73] Assignee: Texas Instruments Incorporated, Dallas, Tex.

[21] Appl. No.: 18,874

[22] Filed: Feb. 24, 1987

[51] Int. Cl.$^4$ .............................................. G11C 7/00
[52] U.S. Cl. .................................... 365/189; 365/190; 365/177
[58] Field of Search ............... 365/177, 190, 205, 207, 365/208, 181, 189, 155, 179, 204

[56] References Cited

U.S. PATENT DOCUMENTS

| | | | |
|---|---|---|---|
| 4,539,659 | 9/1985 | Dumont | 365/155 |
| 4,616,342 | 10/1986 | Miyamoto | 365/205 |
| 4,646,268 | 2/1987 | Kuno | 365/189 |
| 4,658,159 | 4/1987 | Miyamoto | 365/190 |

FOREIGN PATENT DOCUMENTS

| | | | |
|---|---|---|---|
| 0023792 | 2/1981 | European Pat. Off. | 365/155 |
| 0136811 | 4/1985 | European Pat. Off. | 365/190 |
| 8502314 | 6/1985 | World Int. Prop. O. | 365/205 |

*Primary Examiner*—Stuart N. Hecker
*Assistant Examiner*—Glenn A. Gossage
*Attorney, Agent, or Firm*—Rodney M. Anderson; Leo N. Heiting; Melvin Sharp

[57] ABSTRACT

A bipolar-CMOS static random access memory device which includes a plurality of static random access memory cells arranged in columns and rows, complementary pairs of bit lines coupled to the cells in each row, word lines coupled to the cells in each row of the cells and a plurality of sense amplifiers and write circuits, with a separate sense amplifier and write circuit coupled to each pair of the complementary bit lines.

9 Claims, 2 Drawing Sheets

BIPOLAR-CMOS STATIC RAM MEMORY DEVICE

BACKGROUND OF THE INVENTION

The present invention relates to bipolar-CMOS static ram memory array device of a type that provides both high density and short access times.

Bipolar and CMOS processes have recently been combined to obtain the advantages of the high speed of bipolar transistors together with the low power of CMOS devices. Such circuits are particularly useful for static random access memory arrays (SRAMS) in view of the otherwise high power dissipation of a bipolar emitter coupled logic RAM. Combined bipolar and CMOS SRAM arrays typically achieve less than ½ the power dissipation of a totally bipolar SRAM array. There is, however, a continuing need to achieve greater speeds and lower power dissipation of SRAM arrays.

Accordingly, it is an object of the invention to provide an improved bipolar-CMOS memory cell array. It is a further object of the present invention to provide such a memory cell array having a faster access time than conventional bipolar-CMOS memory cell arrays.

SUMMARY OF THE INVENTION

According to the invention there is provided a bipolar-CMOS static random access memory device which includes a plurality of static random access memory cells arranged in columns and rows, complementary pairs of bit lines coupled to the cells in each row, word lines coupled to the cells in each row of the cells, and a plurality of sense amplifiers with a separate sense amplifier coupled to each pair of the complementary bit lines.

The device may include a bipolar clamp transistor coupled to each bit line which is operative in response to data input signals to turn on and charge associated bit lines during a read cycle.

The data output and data input lines may be electrically isolated from the bit lines by corresponding high impedance paths.

Preferably the sense amplifiers are differential pair bipolar sense amplifiers whose bases are coupled to corresponding bit lines and whose collectors ar connected to associated data output lines.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
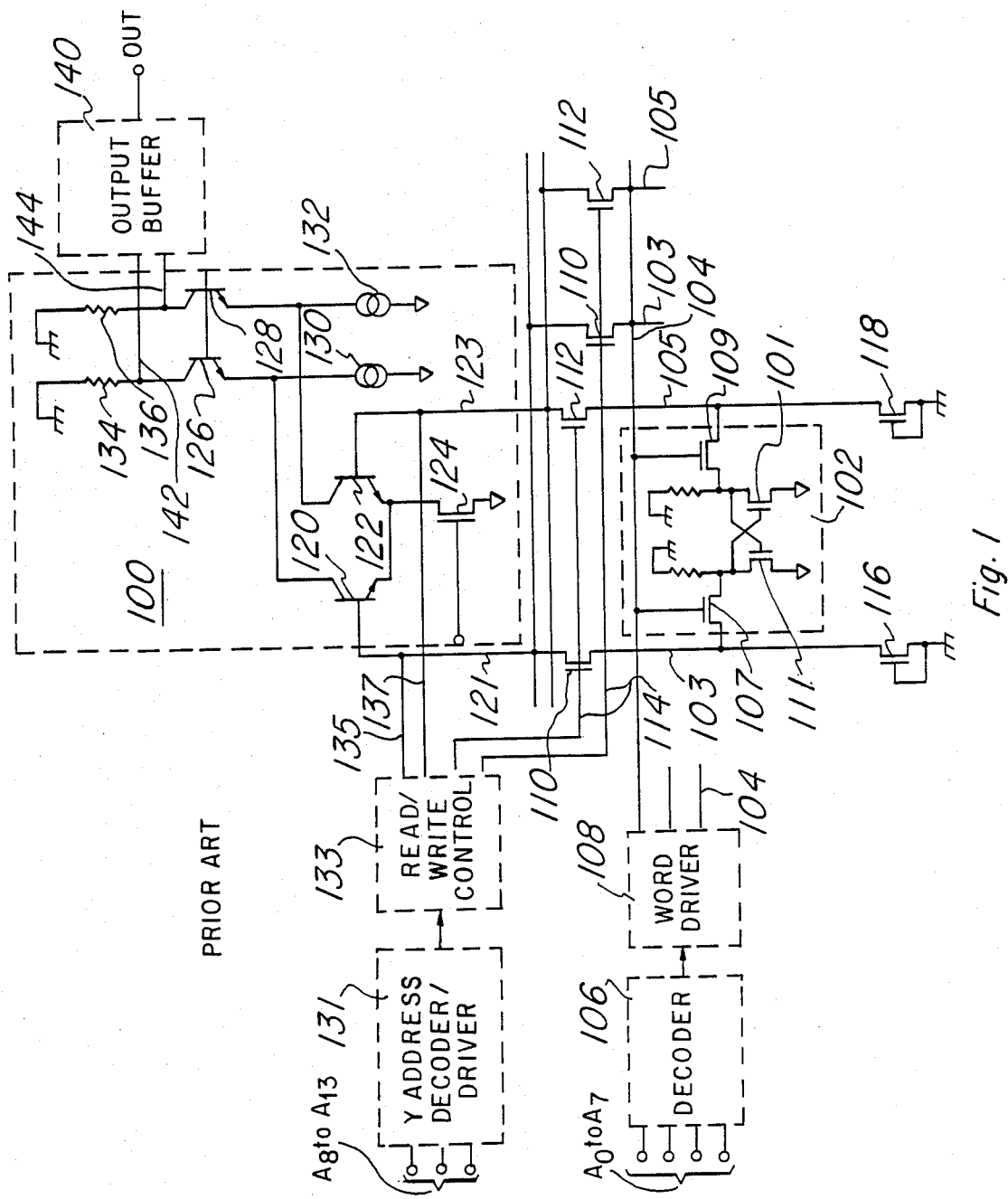
FIG. 1 is a schematic circuit diagram of bipolar-CMOS sense amplifier coupled to a static ram memory array including input decoders and drivers and output buffer according to the prior art.

Referring to FIG. 1 there is shown the circuitry associated with a static RAM memory cell array in bipolar-CMOS according to the prior art. This circuit is particularly adapted for incorporation onto a semiconductor chip in accordance with known process techniques. The circuit includes a plurality of static ram memory cells arranged in columns and rows. Each column consists of a pair of complementary bit lines 103 and 105 coupled at one end to ground through load transistors 116 and 118, respectfully. Bit lines 103 and 105 are coupled to each memory cell 102 in a column (only one memory cell 102 is shown in FIG. 1) such that bit line 103 connects to access transistor 107 while bit line 105 connects to access transistor 109. Access transistors 107 and 109 of each cell in a given row have their gates connected to a selection line 104 coupled to the output of a word driver 108 and associated decoder 106. The decoder 106 has inputs $A_0$ to $A_7$ the combination of which determine which output from the word driver 108 goes high.

Bit lines 103 and 105 connect to input lines 121 and 123, respectfully, of a sense amplifier 100 through bit line select transistors 110 and 112, respectfully. The gates of transistors 110 and 112 are driven by a read/write control circuit 133 along lines 114. There is one line 114 for each column of memory cells 102. The lines 121 and 123 connect to the base of NPN bipolar transistors 120 and 122, respectfully. The emitters of the latter transistors are connected together and lead through a pass gate transistor 124 to a negative voltage supply of about −5.2 volts. The collectors of transistors 120 and 122 connect to the emitters of transistors 126 and 128 and to ground through constant current generators 130 and 132, respectfully. The collector of transistors 126 and 128 connect through resistors 134 and 136, respectfully, to ground and along lines 142 and 144, respectfully, to the input of output buffer 140. Driving read/write control circuit 133 is a Y address decoder/driver 131 which has inputs $A_8$ to $A_{13}$. Depending on the combination of input signals on the latter inputs, a given one of lines 135 and 137 is driven high and a given one of lines 114 are driven high thereby selecting a given column in the array.

Operationally, a write cycle occurs as follows. Assume that line 135 is driven high and transistors 110 and 112 are turned on by line 114 going high. Then the high signal passes through access transistor 107 into the gate of transistor 101 turning the latter on. The falling drain of transistor 101 is applied to the gate of transistor 111 turning it off.

A read cycle takes place by a given line 114 going high and turning on a corresponding set of pass transistors 110 and 112 to couple lines 121 and 103 and lines 123 and 105. At the same time a selected word line 104 goes high coupling the drain of transistor 111 and 101 to lines 103 and 105, respectively. Transistor 124 is turned on to provide a current path for transistors 120 and 122. With the drain of transistor 111 low, bit line 103 is pulled low while bit line 105 remains high. The pulling down of bit line 103 also pulls down line 121 resulting in a diminished conductivity of transistor 120 and a lowered current through transistor 126. The lowered current through transistor 126 raises the voltage of line 142. The opposite effect occurs with the other side of the sense amplifier with transistor 122 being driven on by the high level of bit line 105 and line 123. Thus, line 144 is low relative to line 142. Obviously, with transistor 101 off rather than transistor 111, line 144 will be high relative to line 142.

It will be appreciated that sense amplifier 100 serves all of the columns of the array so that lines 121 and 123 have a large capacity associated with all of the sources of transistors 110 and 112 coupled thereto and the length of the interconnecting conductive lines. This capacity slows down the read cycle as well as the write cycle. Following a write cycle the line pulled low, in our example line 103, must be recharged through load transistor 116 while during a write, line 103 is pulled low at the same time transistor 116 is supplying charge which tends to work against the pulling down action. Thus, transistor 116 (and transistor 118) also tend to slow down the write cycle.

It will also be appreciated that another factor which determines the degree to which line 103 will be pulled down is set by the time line 135 is low and the coupled capacity on line 121. If line 135 swings a significant proportion of the whole of the power supply voltage then line 103 will undergo a substantial voltage swing. The need to recharge line 103 through a significant voltage will also slow down the write recovery time as well as involve a relatively large power consumption.

Figure 2:
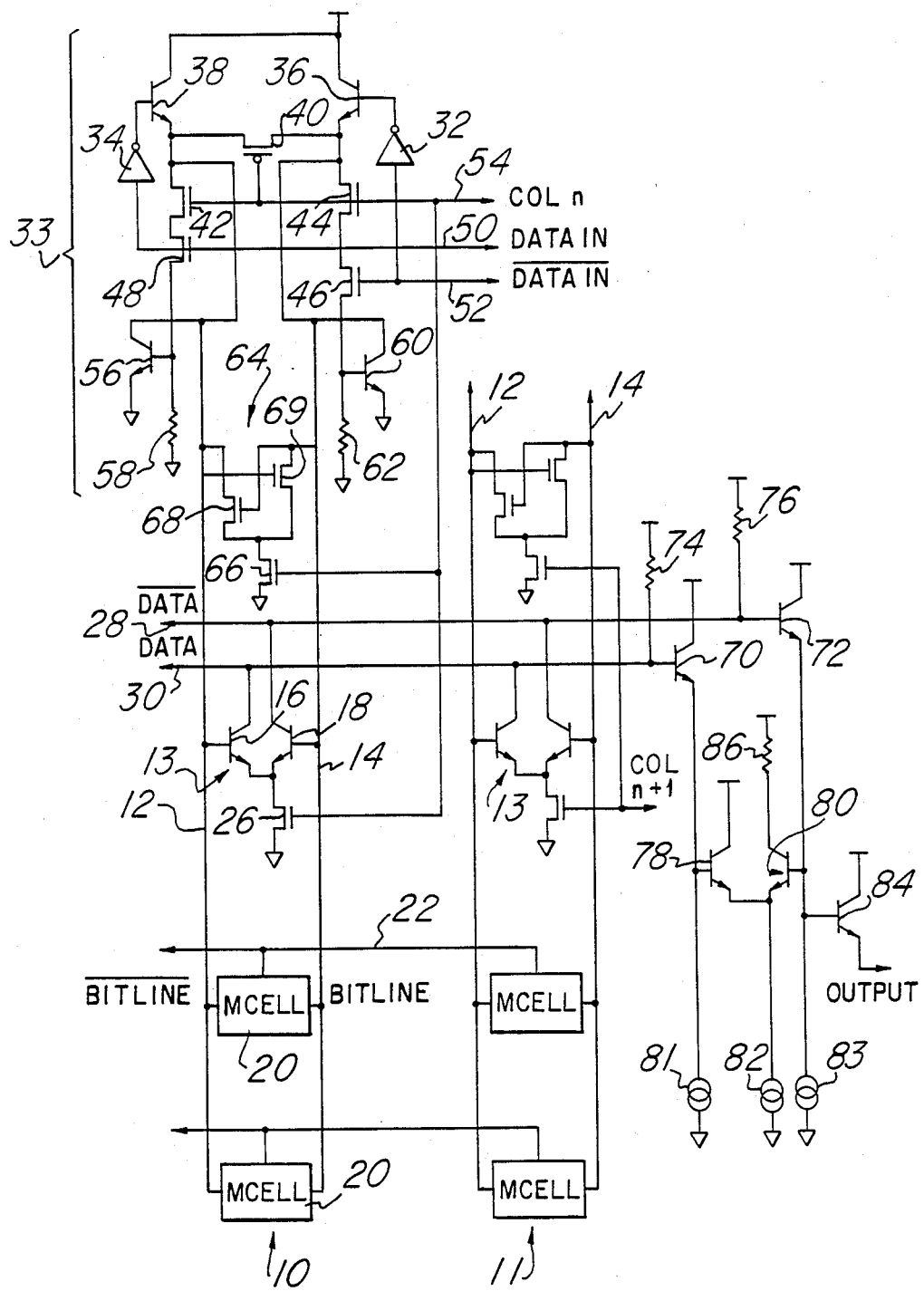
FIG. 2 is a schematic circuit diagram of a bipolar-CMOS set of sense amplifiers and the array circuitry used in connection with a plurality of static ram memory cells according to a preferred embodiment of the invention herein.

Referring to FIG. 2 there is shown a circuit according to a preferred embodiment of the invention consisting of an array of static RAM memory cells 20 arranged in columns 10, 11, etc. with each column having complementary bit lines 12 and 14. Selection lines 22 select a given row of such cells 20. For simplicity only two columns are shown but ordinarily there are a large number of both columns and rows in the array. To the bit lines 12 and 14 in each column there is coupled an associated sense amplifier 13 made up of NPN bipolar transistors 13 and 18 whose emitters are coupled together through a sense amplifier selection transistor 26 to the negative supply voltage. The collectors of transistors 16 and 18 are connected directly to complementary data lines 30 and 28, respectively. Data lines 28 and 30 are charged through resistors 76 and 74, respectively, which are each coupled to a high voltage supply and are also fed to the bases of NPN bipolar transistors 72 and 70, respectively. The collectors of transistors 70 and 72 are connected directly to the high voltage supply while the emitters are coupled to ground through current sources 81 and 83. The base of transistors 78 and 80 are coupled to the emitters of transistors 70 and 72 while their emitters are coupled together and to ground through a constant current source 82. A resistor 86 in the collector of transistor 80 forms a load resistor across which the base and collector of transistor 84 are coupled. Thus the output of a selected sense amplifier appears at the emitter of transistor 84.

Circuit 64 is a current latch circuit consisting of a latch selection transistor 66 coupled between ground and the sources of transistors 68 and 69. The gates of transistors 68 and 69 are connected to bit lines 14 and 12, respectively, while the drains of transistors 68 and 69 are connected to the gates of transistors 69 and 68, respectively. With bit line 12 low and line 14 high, transistor 69 will be of lower conductivity than transistor 68. Thus, the higher conductivity of transistor 68 will tend to keep bitline 12 discharged and maintain its low voltage condition.

A pullup and write circuit 33 also coupled to the bitlines 12 and 14 consists of a pair of NPN bipolar transistors 36 and 38 whose collectors ar coupled to the high voltage supply. The emitters of transistors 36 and 38 are coupled directly to bitlines 14 and 12, respectively. Inverters 32 and 34 couple data input lines 52 and 50 to the base of transistors 36 and 38, respectively. P-channel transistor 40 is coupled across the emitters of transistors 36 and 38 and functions to equalize the voltage on the bitlines 12 and 14 when a column select line 54 is low or unselected. Transistors 56 and 60 function to pull down the corresponding bitlines 12 and 14 when associated transistors 48, 42 and 44, 46 are on, respectively. Current through resistors 58 and 62 provides the bias current needed to turn off transistors 56 and 60, respectively.

In a write cycle, one of data input lines 50 and 52 will be high and the other low. Assume that line 50 is high and line 52 is low. Thus, the input to the base of transistor 38 will be low and transistor 38 will be off while transistor 36 will be on. Column select line 54 for the selected column will be high turning on transistor 42. Since transistor 48 was also turned on by line 50 going high, any voltage on bit line 12 will result in current through resistor 58 and base current through transistor 56 turning on transistor pulling down bit line 12. At the same time the emitter of transistor 36 raises the voltage on bitline 14 to the supply voltage less the emitter base voltage of transistor 36 or about 4.4 volts. With line 22 going high for a selected row, the selected cell 20 will be written into.

Once the column select line 54 goes low, pulldown transistor 56 goes off as its base is pulled down by resistor 58 discharging the base of transistor 56 to ground. Both transistors 38 and 36 are turned on when the voltages on data input lines 50 and 52 go low thereby charging the complementary bit lines 12 and 14 both to $V_{cc}-V_{be}$, or about 4.4 volts. Both the sense amplifier 13 and the current latch 64 become decoupled when the voltage on the column select line 54 goes low. Since the bit lines have individual pullup and write 33 and sense amplifier 13 circuits there is relatively little capacitance associated with the bit lines on each column so that write recovery can be fast, particularly since transistors 36 and 38 are low impedance charging circuits. Once column select line 54 goes low, transistor 40 turns on equalizing the voltage on the complementary bit lines 12 and 14.

Read of a selected memory cell is accomplished by raising the voltage on a selected row line 22 and on a selected column line 54. Data input lines 50 and 52 are kept low during read. Both transistors 36 and 38 are on clamping bit lines 12 and 14 to $V_{cc}-V_{be}$. Column select line 54 is raised turning on transistor 26 to select the corresponding sense amplifier circuit 13. With cell 20 coupled to the bit lines, one of the bit lines will be pulled down a slight amount more than the other due to the increased current demand by one side of the memory cell over that of the other side. In addition, the current latch 64 will enhance the voltage difference between the two complementary bit lines 12 and 14. The difference in voltage between one bit line and the other will be only of the order of 50–100 millivolts.

Thus, the circuit of FIG. 2 provides much reduced access time over that of FIG. 1 by reason of the lower capacity coupled to a selected sense amplifier, the reduced voltage swing of the bit lines during a read operation, the much faster write recovery provided by using bipolar transistors to recharge the bit lines and decoupling any load attached to the bit lines during a write recovery period. Finally, by providing a separate data input from that of the data output, one can get a faster write time.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A bipolar-CMOS static RAM device having a plurality of static RAM cells arranged in columns and rows, comprising:
    a plurality of complementary bit line pairs, each bit line pair coupled to an associated column of said cells;
    a plurality of word lines, each word line coupled to a row of said cells; and
    a plurality of write circuits for writing data into associated columns of cells, each write circuit respectively coupled to a single bit line pair and comprising:
        first and second bipolar write transistors each having their emitters connected to a reference voltage, and each having their collectors coupled to one of the bit lines in the associated bit line pair;
        first and second resistors connected between the base of said first and second bipolar write transistors and said reference voltage; and
        first and second pass transistors having their source-to-drain paths connected in series between the base and collector of said first and second transistors, respectively, and having their gates connected to complementary data input lines.

2. A device according to claim 1, wherein each of said write circuits further comprises:
    first and second bipolar clamp transistors each having its emitter connected to one of the bit lines of its associated bit line pair, having its collector connected to a pull-up voltage, said first and second bipolar clamp transistors having their bases coupled to said complementary data input lines.

3. A device according to claim 1, including a plurality of latch circuits with each latch circuit formed by a pair of cross coupled transistors coupled to an associated bit line pair.

4. A device according to claim 1, including equalizing transistors with each such transistor having a source of drain path connected between the bit lines in an associated pair of bit lines, and having a gate controlled by a single level on a column select line so that, responsive to non-selection of the associated column of said cells, said equalizing transistors conduct to equalize the voltage on the bit lines in said associated pair of bit lines.

5. A device according to claim 1, wherein each write circuit further comprises first and second select transistors, each having its source-to-drain path connected in series between the bases of said first and second bipolar write transistors and the bit lines of its associated bit line pair, and each having a gate for receiving the column select signal, said first and second select transistors of a write circuit conducting when its associated column is selected.

6. A device according to claim 1, wherein each memory cell comprises a pair of cross-coupled CMOS inverters.

7. A device according to claim 1, further comprising:
    a plurality of sense amplifiers, each of said sense amplifiers being coupled to a single bit line pair.

8. A device according to claim 7, further comprising:
    a plurality of latch circuits with each latch circuit formed by a pair of cross coupled transistors coupled to an associated bit line pair.

9. A device according to claim 8, wherein each latch circuit comprises:
    a cross coupled transistor pair, each transistor having its drain connected to one of the bit lines, and its gate connected to the other of the bit lines, in its associated bit line pair; and
    a discharge transistor having its source-to-drain path connected between the sources of the transistors in said cross coupled transistor pair, and having its gate controlled by said column select signal.

* * * * *